United States Patent
Chang et al.

(10) Patent No.: US 6,870,212 B2
(45) Date of Patent: Mar. 22, 2005

(54) TRENCH FLASH MEMORY DEVICE AND METHOD OF FABRICATING THEREOF

(75) Inventors: Ko-Hsing Chang, Hsinchu (TW); Chih-Wei Hung, Hsin-chu (TW)

(73) Assignee: Powerchip Semiconductor Corp., Hsinchu (TW)

( * ) Notice: Subject to any disclaimer, the term of this patent is extended or adjusted under 35 U.S.C. 154(b) by 121 days.

(21) Appl. No.: 10/065,345

(22) Filed: Oct. 7, 2002

(65) Prior Publication Data

US 2004/0067618 A1 Apr. 8, 2004

(51) Int. Cl.[7] ............................................. H01L 29/76

(52) U.S. Cl. ...................... 257/314; 257/371

(58) Field of Search ................................. 257/314, 315, 257/316, 317, 318, 319, 320, 369, 371

(56) References Cited

U.S. PATENT DOCUMENTS 6,583,466 B2 * 6/2003 Lin et al. .................... 257/314

* cited by examiner

Primary Examiner—Phuc T. Dang
(74) Attorney, Agent, or Firm—Jianq Chyun IP Office

(57) ABSTRACT

A method of fabricating a trench flash memory device, where the method includes forming a patterned mask layer on the substrate and using it as the mask for form a trench in the substrate. Next, a source region is formed in the substrate near the bottom of the trench, followed by forming a tunnel oxide layer, a floating gate, a gate dielectric layer and a control in the trench. After removing the mask layer to expose the substrate, a drain region is further formed in the substrate. In this invention, since the trench flash memory device has a cylindrical shape with the tunnel oxide layer, the floating gate and the gate dielectric layer wrapping around the control gate, the overlap area between the floating gate and the control gate is increased, resulting in a higher gate coupling rate (GCR), a lower required operation voltage and a higher device operation speed and efficiency.

20 Claims, 12 Drawing Sheets

TRENCH FLASH MEMORY DEVICE AND METHOD OF FABRICATING THEREOF

BACKGROUND OF INVENTION

1. Field of the Invention

This invention relates to a method of fabricating a semiconductor device. More particularly, this invention relates to a trench type flash memory device and the method of fabricating the same.

2. Description of Related Art

Memory device, by the name, is a type used to store information and data. As microprocessor becomes more and more powerful and the programming and calculation performed by software become more and more complicated, the demand for memory devices becomes even higher. In order to expand the capacity and lower the cost of memory devices to accommodate the higher demand for memory devices, The prevailing tendency to increase the device integration in the semiconductor industry has always been the driving force of a continued pursuit of technology and manufacturing process in the fabrication of memory devices.

As an example, flash memory device has been widely used in personal computers and other electronic equipment as the memory device for storing, reading and erasing information, and more advantageously, retaining the information even when the power is off.

A typical flash memory device is generally designed to have a stack-gate structure, which includes a tunneling oxide layer, a polysilicon floating gate for storing charges, an ONO (Oxide-Nitride-Oxide) dielectric layer and a polysilicon control gate to control the reading/writing of information. To perform the programming or the erasing operation on a flash memory device, the source, the drain and the control gate will be appropriately biased to either inject electrons into or to eject electrons from the polysilicon floating gate.

In general, the mode of electron injection for flash memory devices can be classified as Channel Hot-Electron Injection (CHEI) and F-N (Fowler-Nordheim) Tunneling, etc. The operating mode of programming and erasing varies depending on whether electrons are being injected and ejected.

Usually, during an operation of a flash memory device, the greater the gate-coupling ratio (GCR) between the floating gate and control gate, the lower the operation voltage is required. The operational speed and efficiency of the flash memory device are thus greatly increased. The methods of increasing the GCR include increasing the overlapped area between the floating gate and the control gate, reducing the dielectric thickness between the floating gate and the control gate, and increasing the dielectric constant (k) of the dielectric layer between the floating gate and the control gate, etc.

However, accompanying the continuous increase in integration in integrated circuits with a miniaturization of the device dimension, it is also necessary to reduce the cell size of a flash memory device in order to increase the level of integration. The reduction of memory cell size can be achieved by, for example, reducing the gate length of the memory cell and the distance between word lines. However, the reduction of the gate length of the memory cell will shorten the channel length under tunneling oxide, and thus will severe the short channel effect (SCE), leading to an abnormal punch through between source and drain. In addition, during the fabrication process of a flash memory cell, the problem of critical dimension also occurs in the course the photolithography process, which then will further limit the reduction of memory cell dimension.

SUMMARY OF INVENTION

Accordingly, the present invention provides a trench flash memory device and a fabrication method for the same by forming memory cells in trenches, so as to reduce the memory cell size and, as a result, to increase the integration.

The present invention also provides a trench flash memory device and a fabrication method for the same to increase the GCR between a floating gate and a control gate by increasing the overlap area between the two. A required operation voltage is lower, and the operational speed and the device efficiency are maintained.

The present invention further provides a trench type flash memory device and a fabrication method thereof, wherein a long and straight channel length is obtained by controlling the depth of the trench. Further, the problems caused by cell size reduction a typical memory device is prevented.

Accordingly, this invention provides a fabrication method of trench type flash memory devices, where the method includes forming a patterned mask layer on a substrate and followed by forming a trench in the substrate by using the patterned mask layer as a mask. A source region is also formed in the substrate near the bottom of the trench. The method further includes forming a tunnel oxide and a first conductive layer in the trench, where the surface of the first conductive layer is lower than the surface of the substrate. Following that, a conformal gate dielectric layer is formed on the first conductive layer, and a second conductive layer is formed on the substrate, filling up the trench. A portion of the second conductive layer outside of the trench is then removed to expose the mask layer surface, and the mask layer is later removed to expose the substrate surface. A drain region is further formed near the top portion of the trench in the substrate.

In this invention, the method of forming the source region at the bottom of the trench includes first forming a conformal and doped insulating layer, followed by forming a first photoresist layer at the bottom of the trench, where the first photoresist layer, after being accurately etched, does not completely fill the trench but exposes a portion of the insulating layer. Thereafter, the exposed portion of the insulating layer is removed, leaving the insulating layer at the bottom of the trench, as well as forming a cap layer on the trench sidewall. After removing the first photoresist layer, a thermal process is conducted to diffuse the dopant from the doped insulating layer into the substrate to form the source region. Following that, the doped insulating layer at the bottom of the trenchand the cap layer on the trench sidewall are removed. During the thermal process, since a cap layer is formed on the sidewall of the top portion of the trench, further diffusion of the dopant can be blocked and the dopant are confined in the bottom region of the trench.

Further, according to this invention, the step of forming the first conductive layer which has an upper surface lower than the substrate surface includes first forming a second photoresist layer in the trench, where the second photoresist layer, being accurately etched, does not completely fill the trench and exposes a portion of the first conductive layer. The exposed portion of the first conductive layer is then removed, followed by removing the second photoresist layer. Since the upper surface of the first conductive layer (the floating gate) is lower than the substrate surface, a continuous second conductive layer (control gate) is more easily formed in the subsequent manufacturing process.

In addition, according to this invention, a repairing process step is further provided prior to the formation of the tunnel oxide layer in order to repair the damages at the bottom as well as on the sidewall of the trench caused by the etching process. This repairing process includes a thermal oxidation process, which forms a sacrificial oxide layer on the exposed trench surface, so as to repair the etch-process-induced damages. The sacrificial oxide layer is then removed later.

Furthermore, this invention includes a step of forming a first conduction type first well region that connects with a source region in the substrate, forming a second conductive type second well region above the first conduction type first well region and forming a first conductive type third well region that runs through the second conductive type second well region and connects with the first conductive type first well region in the substrate.

This invention provides a method of forming a trench in the substrate and followed with forming a source region in the substrate near the bottom region of the trench. Next, a tunnel oxide layer, a floating gate, a gate dielectric layer and a control gate are sequentially formed in the trench. A drain region is further formed in the substrate near the top portion of the trench. The well regions are used to connect the source regions, and the region between the well regions and the drain regions near the trench is used as channel region. In this invention, since the trench flash memory device has a cylindrical shape with the tunnel oxide layer, the floating gate and the gate dielectric layer wrapping around the control gate, the overlapped area between the floating gate and the control gate is increased, resulting in a higher gate coupling rate (GCR), a lower required operation voltage and a higher device operational speed and efficiency.

This invention also provides a trench flash memory device, which includes a substrate with a trench, a gate structure, a source region and a drain region. The gate structure is formed inside the trench, where the gate structure from outer to inward, has a tunnel oxide, a floating gate, a gate dielectric layer and a control gate, where the tunnel oxide layer, the floating gate and the gate dielectric layer wrap around the control gate. The source region is formed in the substrate and surrounding the bottom region of the trench. The drain region is further formed in the substrate surrounding the top portion of the trench.

The trench flash memory device, according to this invention, further includes: A heavily doped n-type well region resided in the substrate and connected with the source region, a p-type well region above the heavily doped n-type well region, and a n-type well region in the substrate, which continues through the p-type well region and connects with the heavily doped n-type well region.

In this invention, the trench flash memory device has a cylindrical shape, having the tunnel oxide layer, the floating gate and the gate dielectric layer wrapping around the control gate, therefore the overlap area between the floating gate and the control gate is increased, resulting in a higher gate coupling rate (GCR), a lower required operation voltage and a higher device operation speed and efficiency.

In addition, the channel region of the trench flash memory device in this invention is placed in the substrate outside and around the sidewall of the trench (vertical channel). This can increase the device integration density and avoid problems during device shrinking by controlling the trench depth to precisely control the channel length. Further, the cylindrical memory cell structure can increase the current density and increase efficiency of the stage of programming or erasing of the memory device.

BRIEF DESCRIPTION OF DRAWINGS

The invention and its purposes, features, and advantages can be more fully understood by reading the following detailed description of the preferred embodiments with reference made to the accompanying drawings, wherein:

FIGS. 1A to 1I are cross-sectional diagrams showing the fabrication flow of a trench type flash memory device of the current invention.

DETAILED DESCRIPTION

FIGS. 1A to 1I are, according to one preferred embodiment of the invention, cross-sectional diagrams of a process flow for fabricating a trench flash memory device.

Figure 1A:
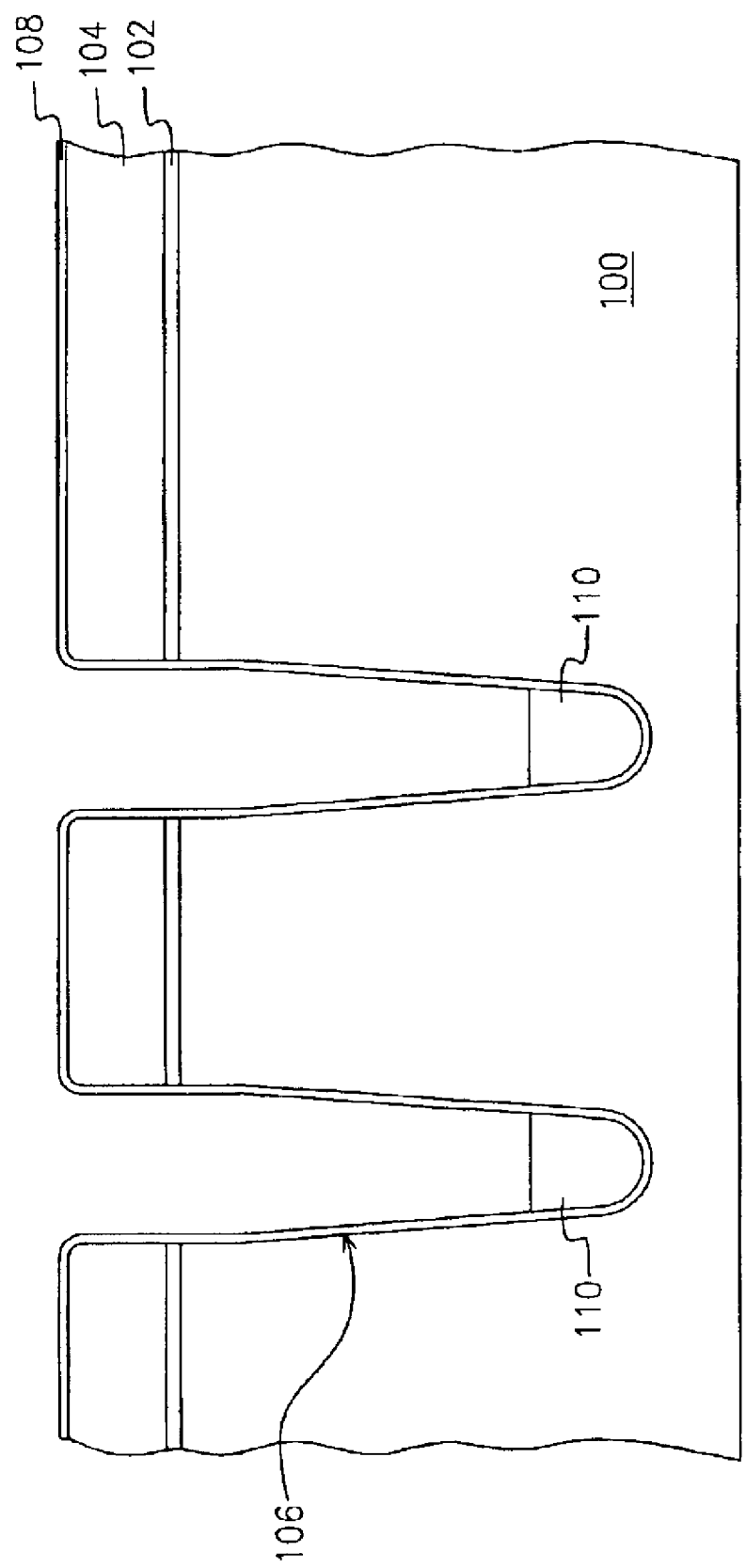

First, referring to FIG. 1A, a substrate 100, such as a semiconductor silicon substrate, is provided. On the substrate 100 surface, a pad oxide layer 102 and a mask layer 104 are formed thereon. A photo/etch process is used to pattern the mask layer 104 and the pad oxide layer 102 to form an opening (not shown) to expose the substrate 100. The material of the pad oxide layer 102 can be, for example, silicon oxide, and the process of making the pad oxide layer can be thermal oxidation. The material of the mask layer 104 can be silicon nitride, and the process of making the mask layer can be chemical vapor deposition (CVD).

Next, using the mask layer 104 as a mask during the etching process, a number of trenches 106 are formed in the substrate 100. The method of etching the trenches 106 includes dry etching process, such as, reactive ion etching process. A repairing process step for repairing the damages made to the sidewall and the bottom of the trench 106 during the etching process is performed. The repairing process includes a thermal oxidation process, which forms a liner oxide layer (not shown) on the exposed surface of the trench 106 to repair the damage caused by the etching process, where the liner oxide layer is then removed after the thermal oxidation process.

In addition, a blanket doped insulating layer 108 is formed on the substrate 100, where the material of the doped insulating layer 108 can be, for example, silicon oxide doped with arsenic ions. The process of forming the doped insulating layer 108 can be, for example, in-situ ion doping CVD process.

Next, a photo resist layer 110 is formed at the bottom of the trench 106, where the photo resist layer 110, after back etching, does not fill up the trenches 106, meaning that the upper surface of the photo resist layer 110 is lower than that of the substrate 100. This photo resist layer 110 can be formed at the bottom of the trench 106 by coating a layer of photo resist (not shown) and etching back to remove the photo resist on top of the substrate 100 as well as a portion of the photo resist inside the trenches 106, leaving only the photo resist layer 110 at the bottom of the trenches 106.

Figure 1B:
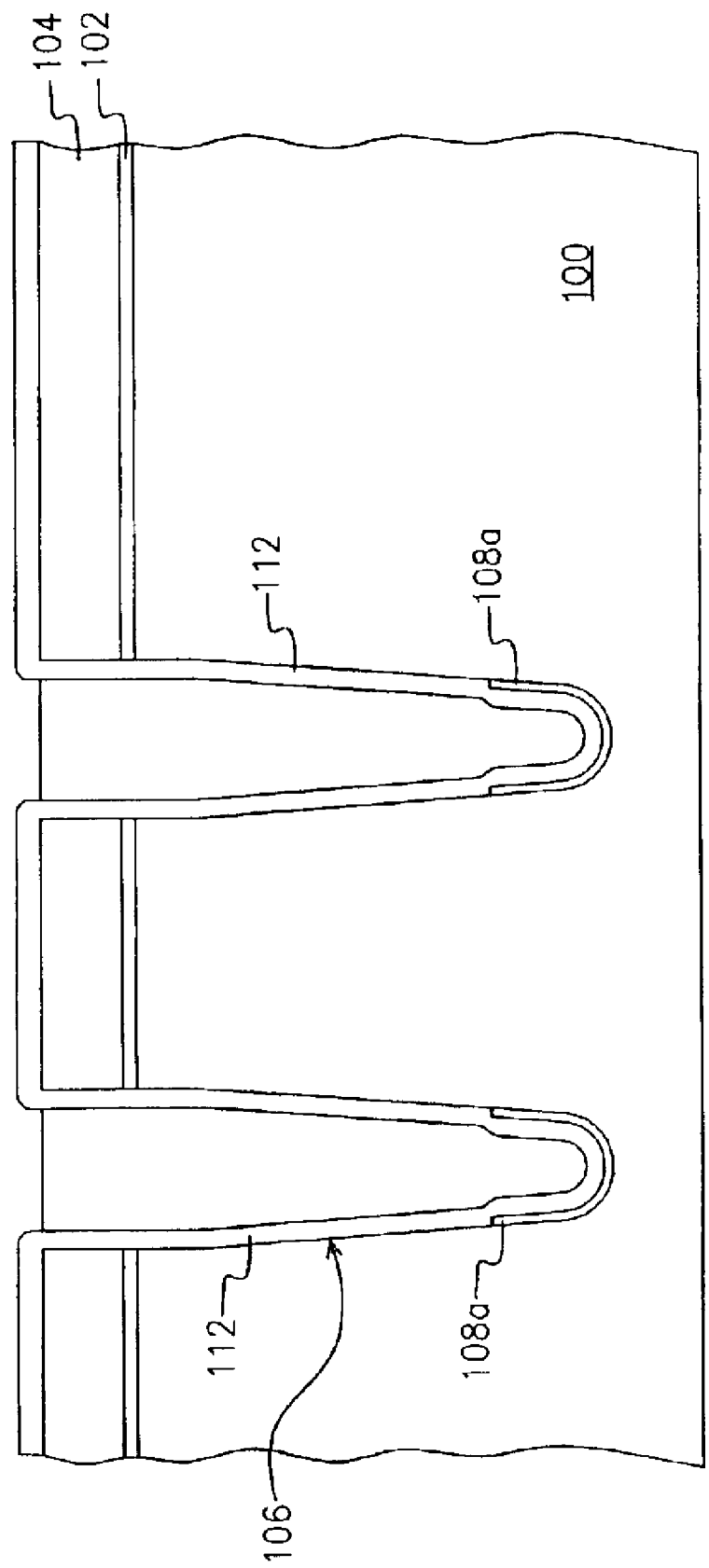

Referring to FIG. 1B, the portion of the doped insulating layer 108 not covered by the photo resist 110 is removed, leaving only the doped insulating layer 108a at the bottom of the trenches 106. The method of removing the portion of the doped insulating layer 108 can be, for example, wet etch process, where buffer HF (BHF) or diluted HF (DHF) can be used as the etchant. After that, the portion of the photoresist layer 110 at the bottom of the trench 106 is removed. A cap layer 112 is then formed on the sidewall of the trenches 106, while exposing surface of the photo resist layer 110 at the same time. The cap layer can be silicon oxide formed by chemical vapor deposition using tetraethylorthosilicate (TEOS)/ozone as reaction gases.

Figure 1C:
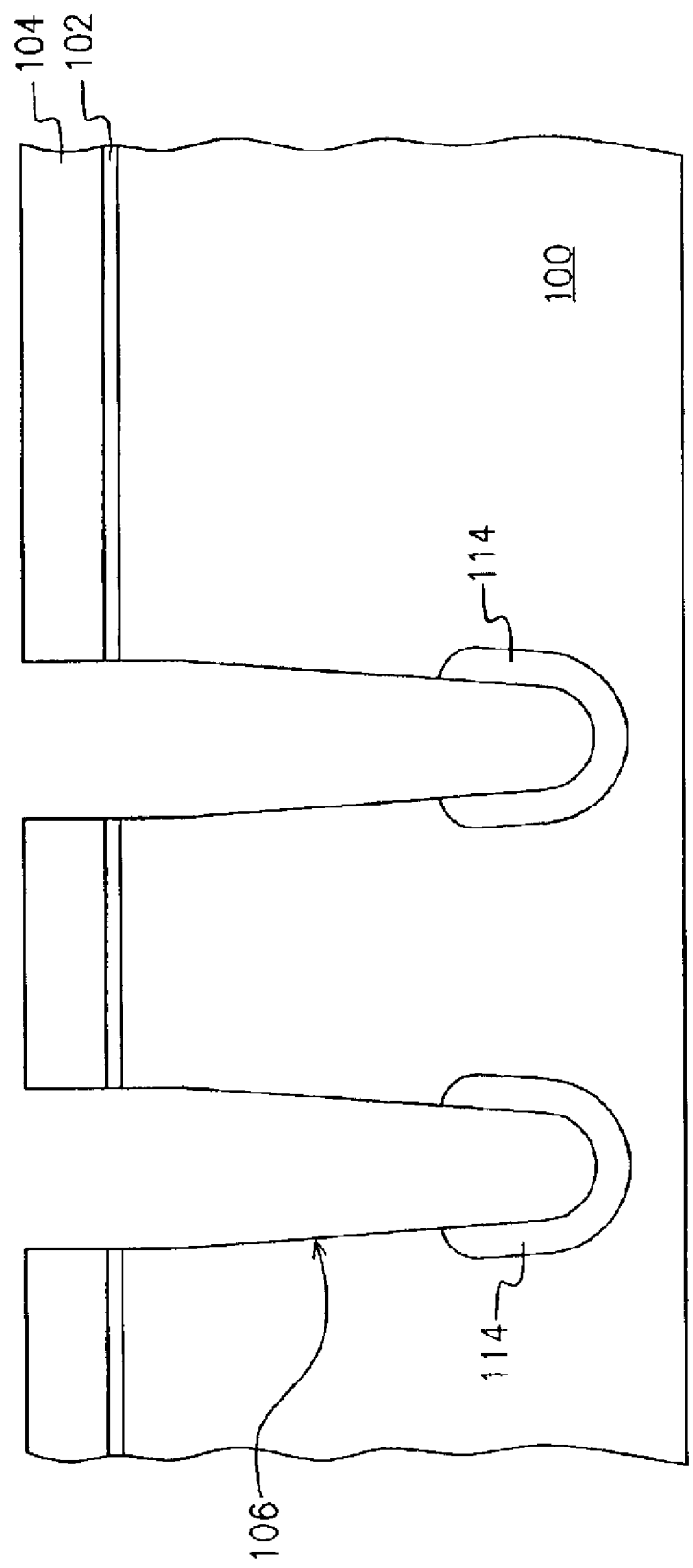

Continue to FIG. 1C, the substrate 100 then goes through a thermal process, allowing the dopant inside the doped insulating layer 108a to diffuse into the substrate 100 at the bottom of the trench 106, forming a doped region 114, which is the source region of this trench flash memory device. Further, since there is a cap layer 112 on the sidewall of and at the upper portion of the trench 106, the upward diffusion from the insulating layer 108a can be blocked, so as to control the diffusion process without making the doped region 114 too large, confining the doped region 114 within the range around the bottom of the trench 106. Following that, the doped insulating layer 108a at the bottom of the trench 106 and the cap layer 112 on the sidewall at the top portion of the trench 106 are removed, where the process of removing the two layers 108a, 112 can be, as an example, a wet etching process, where BHF or DHF can be used as the etchant.

Figure 1D:
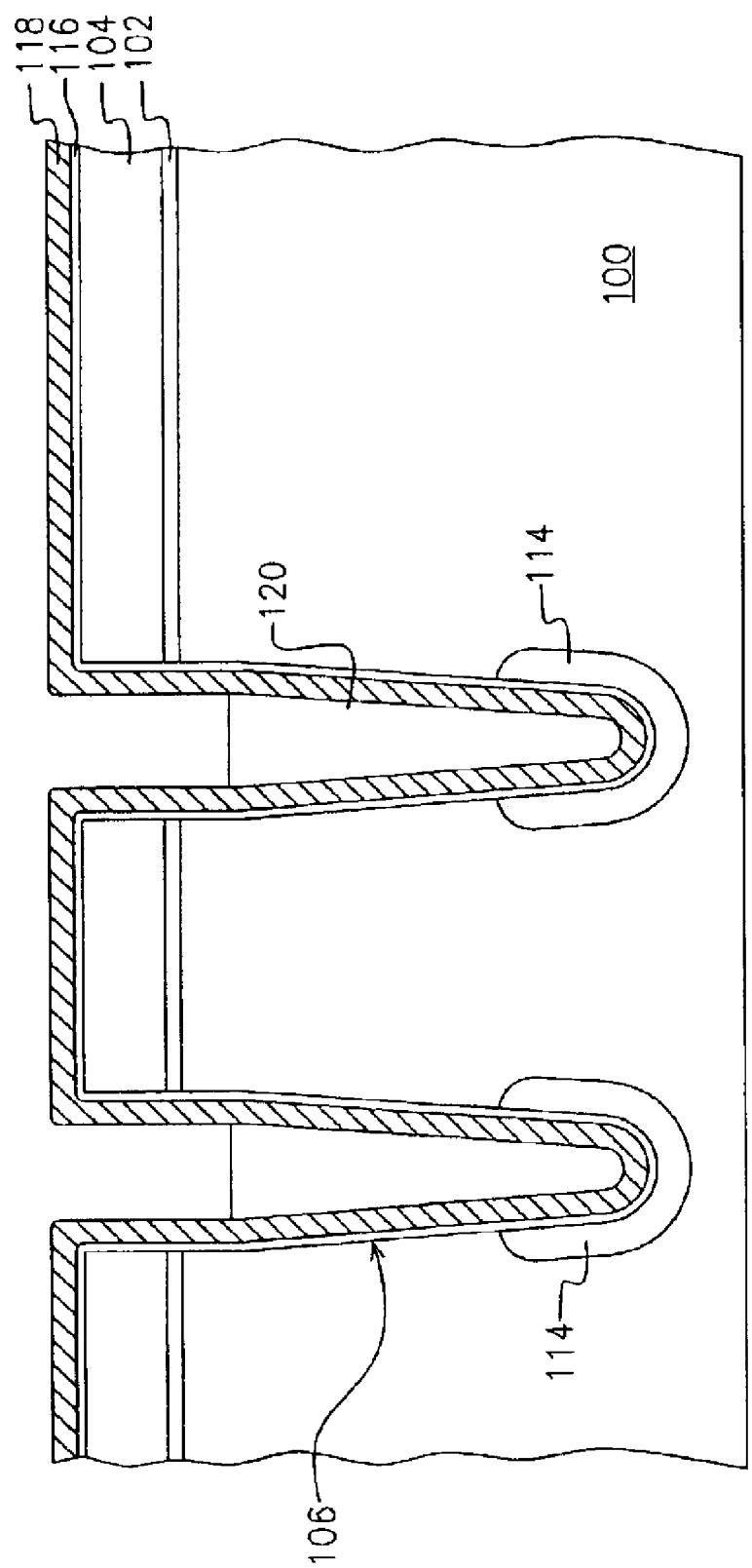

Thereafter, referring to FIG. 1D, a conformal dielectric layer 116 is formed on the substrate 100, covering the trench 106. The dielectric layer 116 can be, for example, silicon oxide, and the method of forming the dielectric layer 116 can be a thermal oxidation process or a low-pressure chemical vapor deposition process. This dielectric layer 116 serves as the tunnel oxide layer of the trench flash memory device.

A conformal conductive layer 118 is then formed on the substrate 100, where the material of the conductive layer 118 can be, for example, doped poly silicon, which has a thickness of, as an example, about 500 angstroms. The conductive layer 118 can be formed by using in-situ ion doping chemical vapor deposition process. Further, after coating a photo resist layer (not shown) on the substrate 100, by conducting an etching process, the photo resist on top surface the substrate 100 and a portion of the photo resist inside the trench 106 are removed, forming a photo resist layer 120 at the bottom of the trench 106, where the upper surface of the photo resist layer 120 is lower than the top surface of the substrate 100.

Figure 1E:
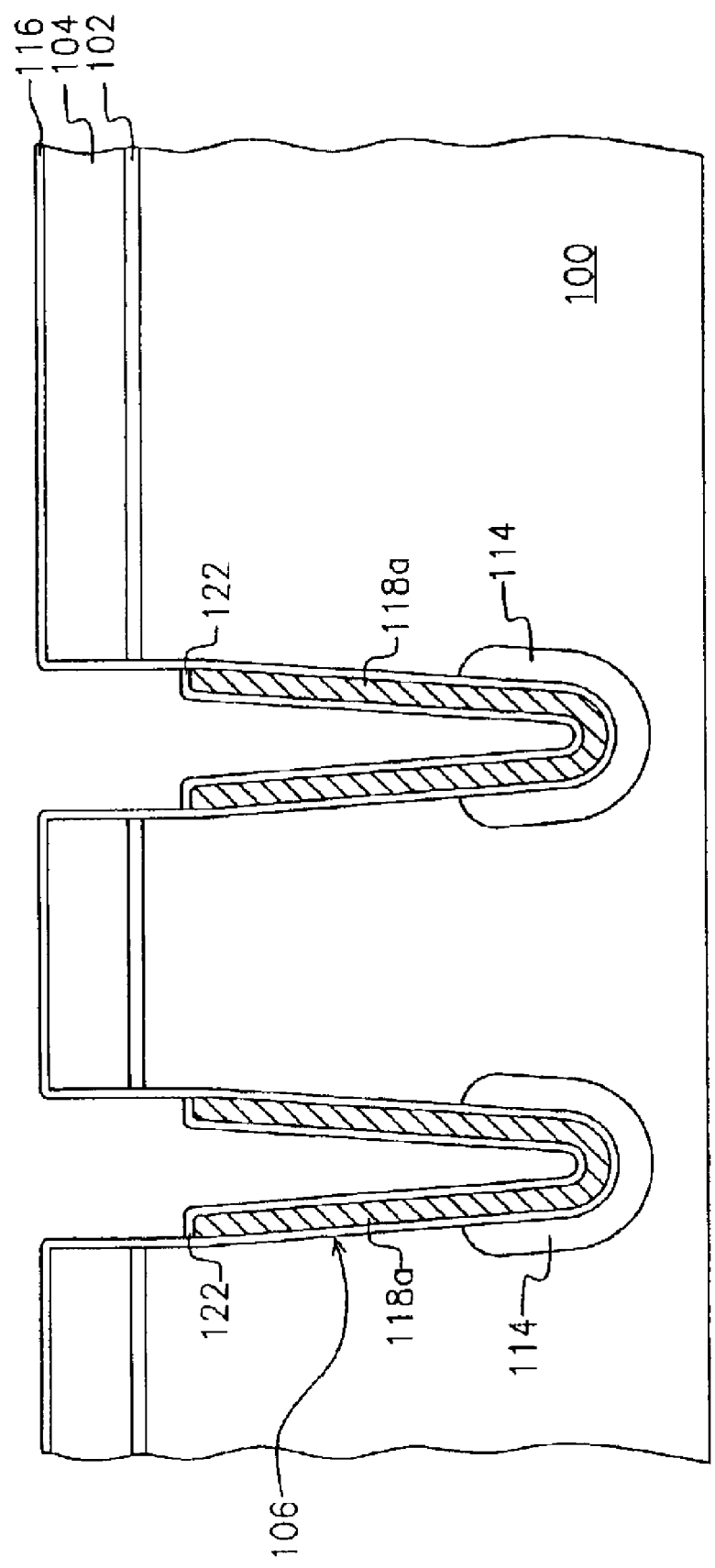

Continue to FIG. 1E, the conductive layer 118 on the top of the substrate 100 as well as the portion inside the trench 106 not covered by the photo resist layer 120 are then removed, leaving the conductive layer 108a inside the trench 106. The process of removing the conductive layer 118 can be, for example, a dry etching process. This conductive layer 118a serves as the floating gate in the trench flash memory device. Note that the upper surface of the conductive layer 118a (floating gate) is lower than the top surface of the substrate 100, a continuous control gate is thus easily formed during the subsequent manufacturing process. Next, after removing the photo resist layer 120, a blanket dielectric layer 122 is then formed on the conductive layer 118a (floating gate), where the dielectric layer 122 can be made of a stack of materials such as silicon oxide/silicon nitride/silicon oxide, etc. The dielectric layer stack 122 has a thickness of, for example, 60/70/60 angstroms, respectively. CVD can be one sample process for forming the dielectric layer stack 122. This dielectric layer stack serves as the gate dielectric layer in the trench flash memory device. It is noted that the dielectric layer stack 122 can also be silicon oxide, silicon oxide/silicon nitride, etc.

Figure 1F:
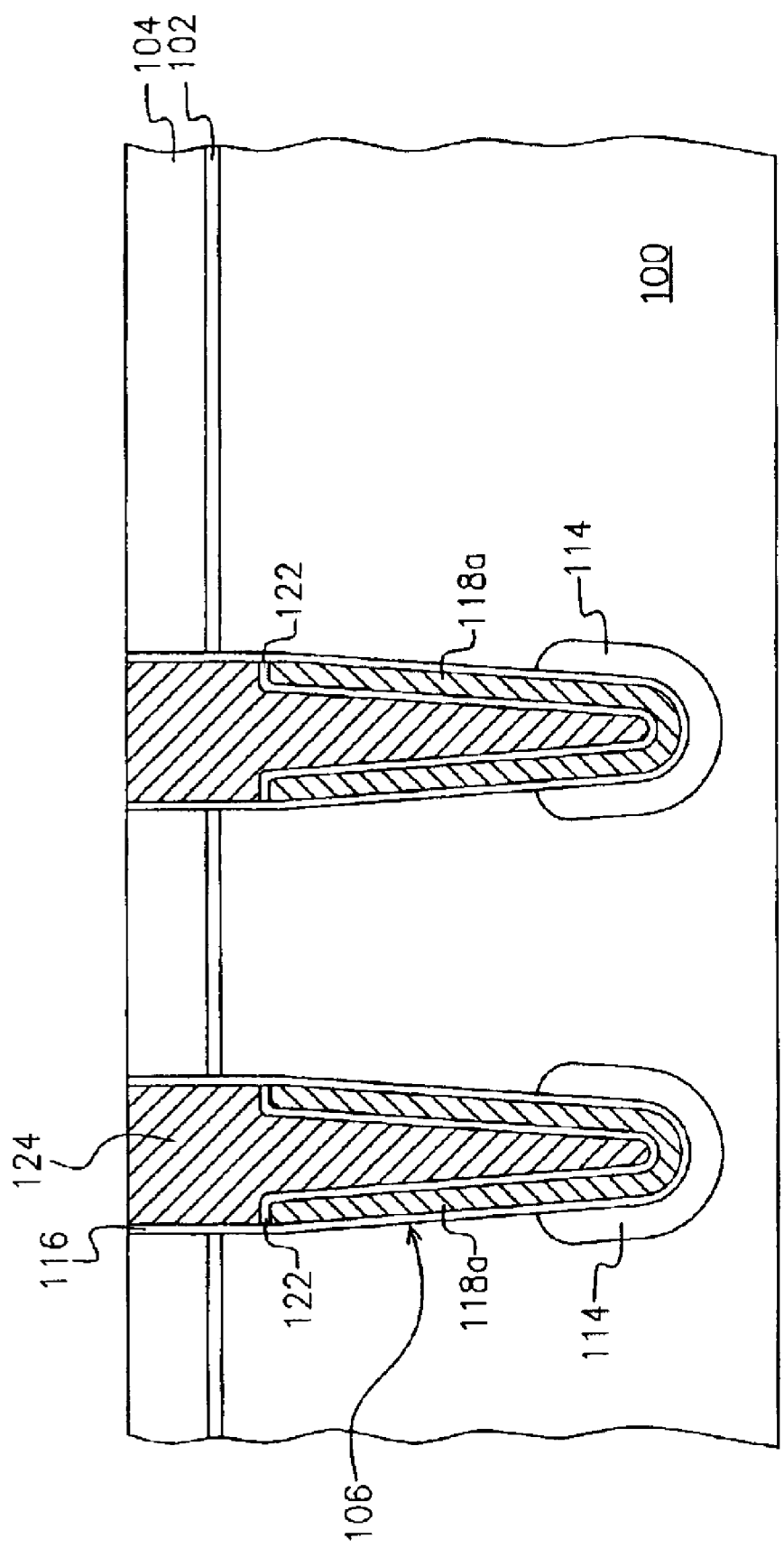
Figure 16:
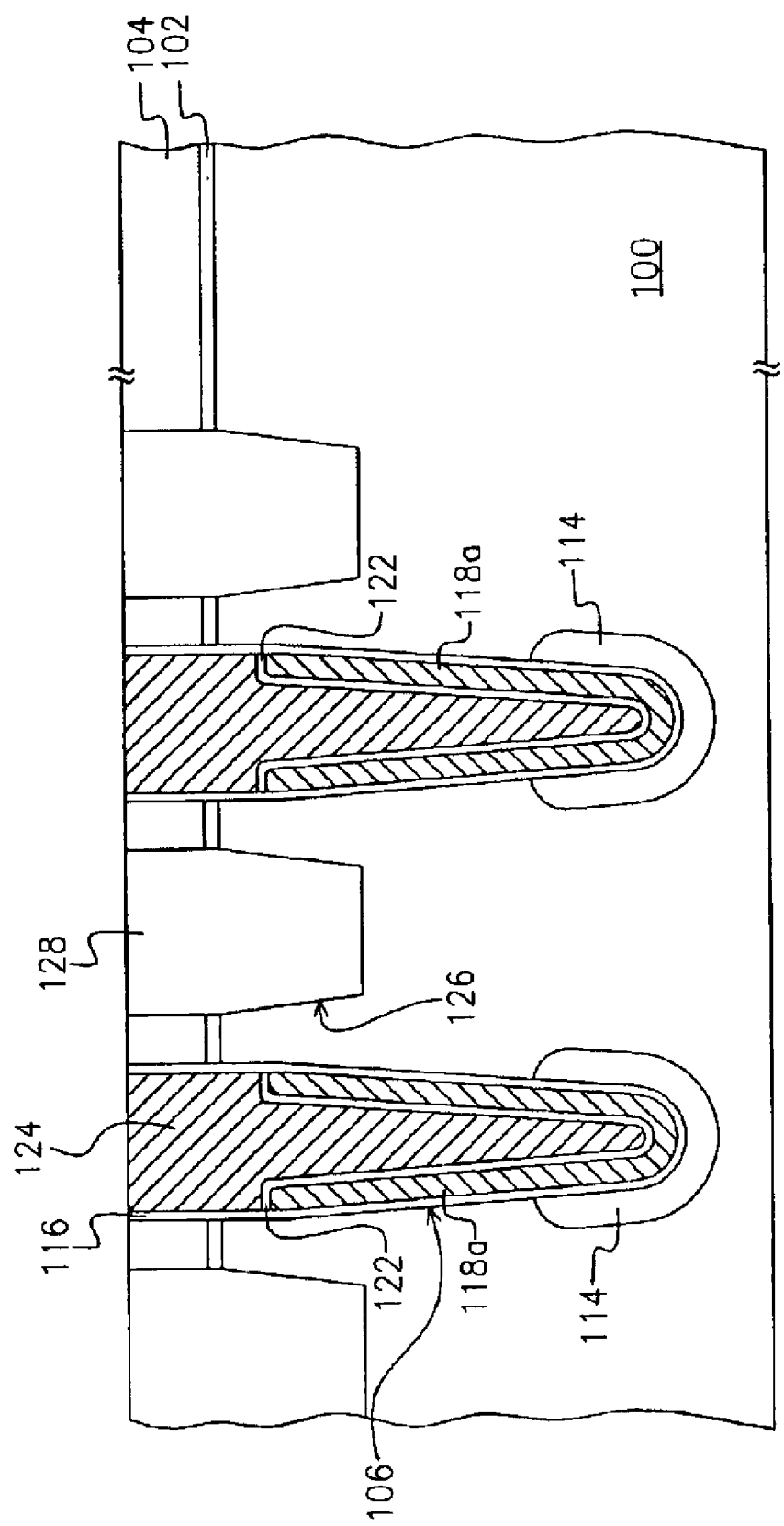

Next, referring to FIG. 1F, another conductive layer 124 is formed on the substrate 100, filling up the trench 106. This conductive layer 124 can be made of a material, such as, polysilicon, and it serves as the control gate in the trench flash memory device. The conductive layer 124 can be formed by using in-situ ion doping process to form a conductive film (not shown) on top of the substrate 100 by chemical vapor deposition, and followed by a chemical mechanical polishing (CMP) step to remove the part of the conductive film outside of the trench 106 as well as the dielectric layer 116 until the surface of the mask layer 104 is exposed.

Further, referring to FIG. 1G, an isolation structure 128 is formed on the substrate 100, where the isolation structure 128 can be field oxide or shallow trench isolation structure. This isolation structure 128 is used for defining the active region and it can be laid out as stripped shape. In this preferred embodiment, the isolation structure 128 is described as a shallow trench structure. The process of forming the isolation structure 128 includes, for example, first patterning the mask layer 104 and the pad oxide layer 102 by using photolithography and etching process, then using the mask layer 104 as the etch mask to etch out a trench 126 in the substrate 100, where the etching process can be plasma etching. After that, a layer of insulating material (not shown) is formed on top of the substrate 100, filling up the trench 126. The insulating material can be silicon oxide, and the process of forming the insulating material includes first depositing a layer of silicon oxide by chemical vapor deposition with $TEOS/O_3$ as reacting gases, then performing a densification process to densify the silicon oxide film structure, and followed by a CMP process which uses the mask layer 104 as the stopping layer until exposing the surface of the mask layer 104.

Figure 1H:
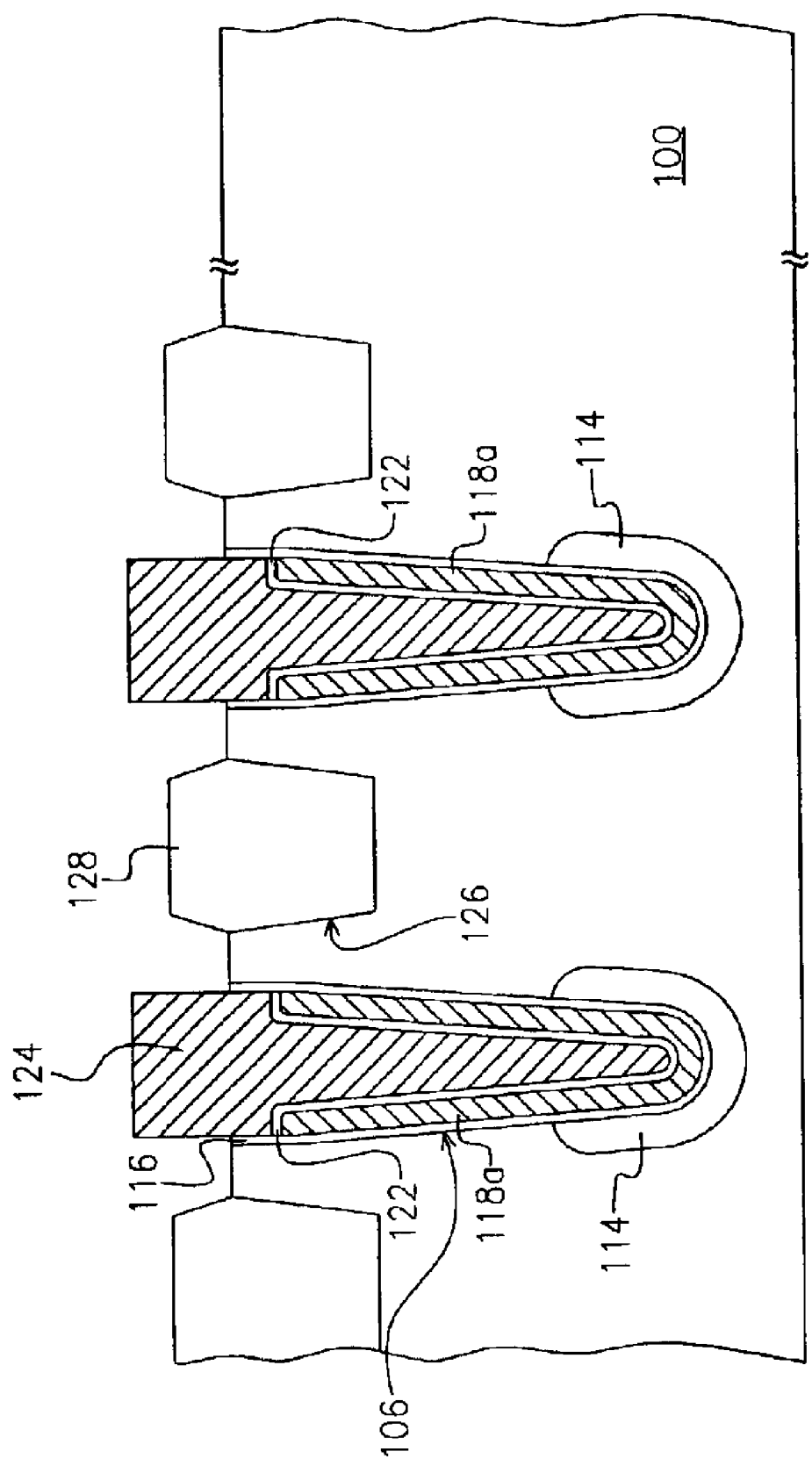

Next, referring to FIG. 1H, the mask layer 104 is removed to expose a part of the pad oxide surface 102. The removing process includes isotropic etching process, such as, a wet etching process, where the pad oxide layer 102 is used as an etch stop and hot phosphoric acid is used as the wet etch chemical. The wet etching process is performed and stopped until the top surface of the substrate 100 is exposed. Further, the pad oxide layer 102 is removed to expose the substrate surface. The method of removing a part of the pad oxide 102 includes isotropic etching, such as, a wet etching process, which uses the substrate 100 as the etch stop layer and uses the fluoric acid solution as the wet etching chemical to etch off the pad oxide 102, until the surface of the substrate 100 is exposed. At the same time, while removing the mask layer 104 and the pad oxide layer 102, part of the isolation structure 128 can also be etched off, causing the surface of the isolation structure lower than that of the conductive layer 124. Also, a part of the dielectric layer 116 at the top sidewall of the conductive layer 124 can also be removed during the etching process, causing the conductive layer 124 (control gate) being higher than the trench 106.

Figure 1I:
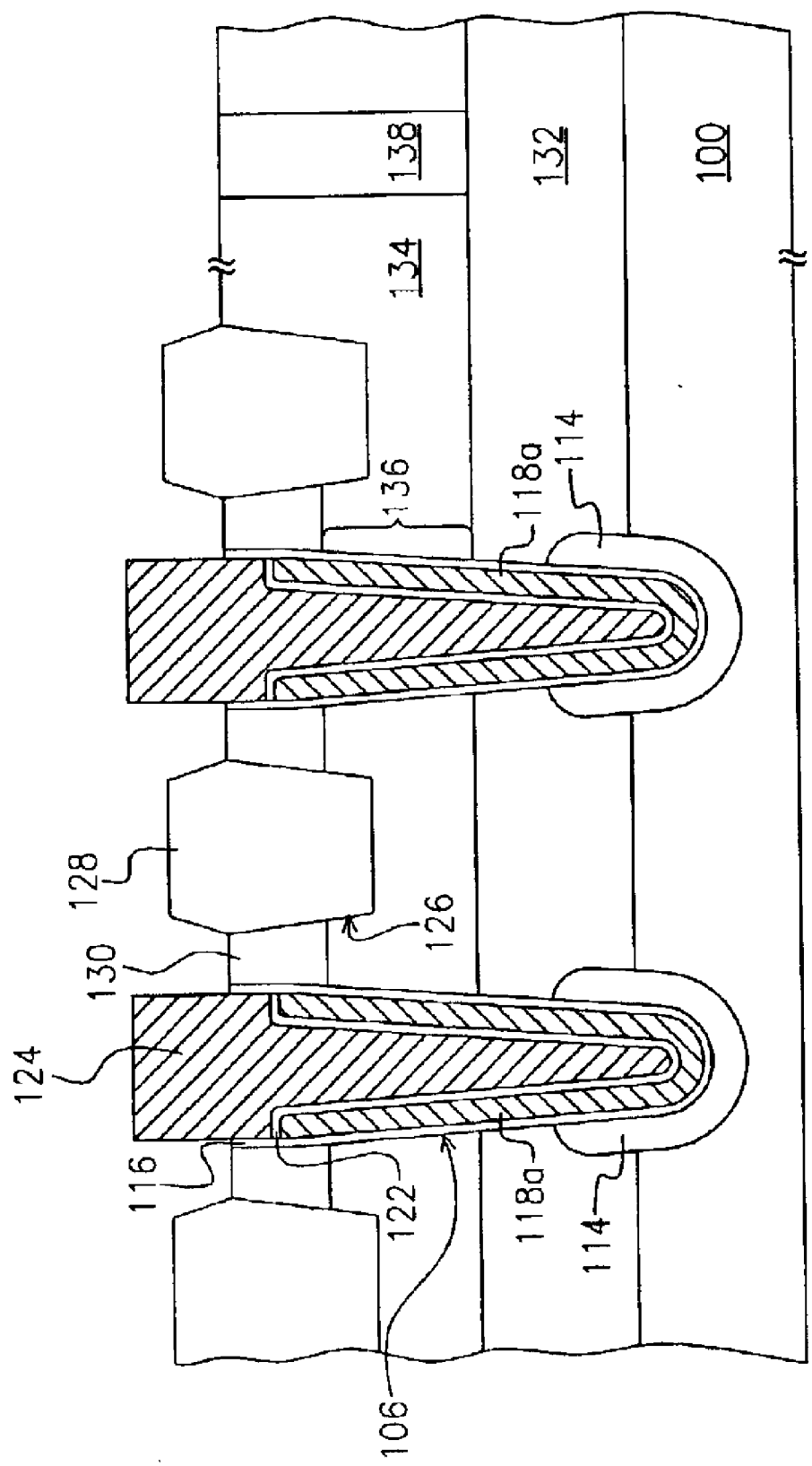

Continuously, according to FIG. 1I, an ion implantation process is performed, using the conductive layer 124 as an implantation mask, to implant the dopant into the substrate 100 region near the conductive layer 124, forming a doped region 130, which serves as the drain region of the trench flash memory device. The implanted dopant can be ions such as arsenic ions, the implant energy is at about 50 keV, and the implant dose is around $1E15$ atoms/cm$^2$. Next, a deep n-type well region 132 is formed in the substrate 100, connecting all the doped regions 114 in the substrate 100. Further, a p-type well region 134 is formed on the top of the deep n-type well region 132, thereby forming a channel region 136 of the trench type flash memory device, where the channel region 136 is located near the sidewall of the trench 106 and in the region between the doped region 130 and the deep n-type well region 132. Subsequently, another n-type well region 138 is formed in the substrate 100, where the n-type well region 138 runs through the p-type well region 134 and connects with the deep n-type well region 132. The remaining back-end process for completing the fabrication of a flash memory device is well known to those skilled in the art, therefore will not be further described herein.

Figure 2:
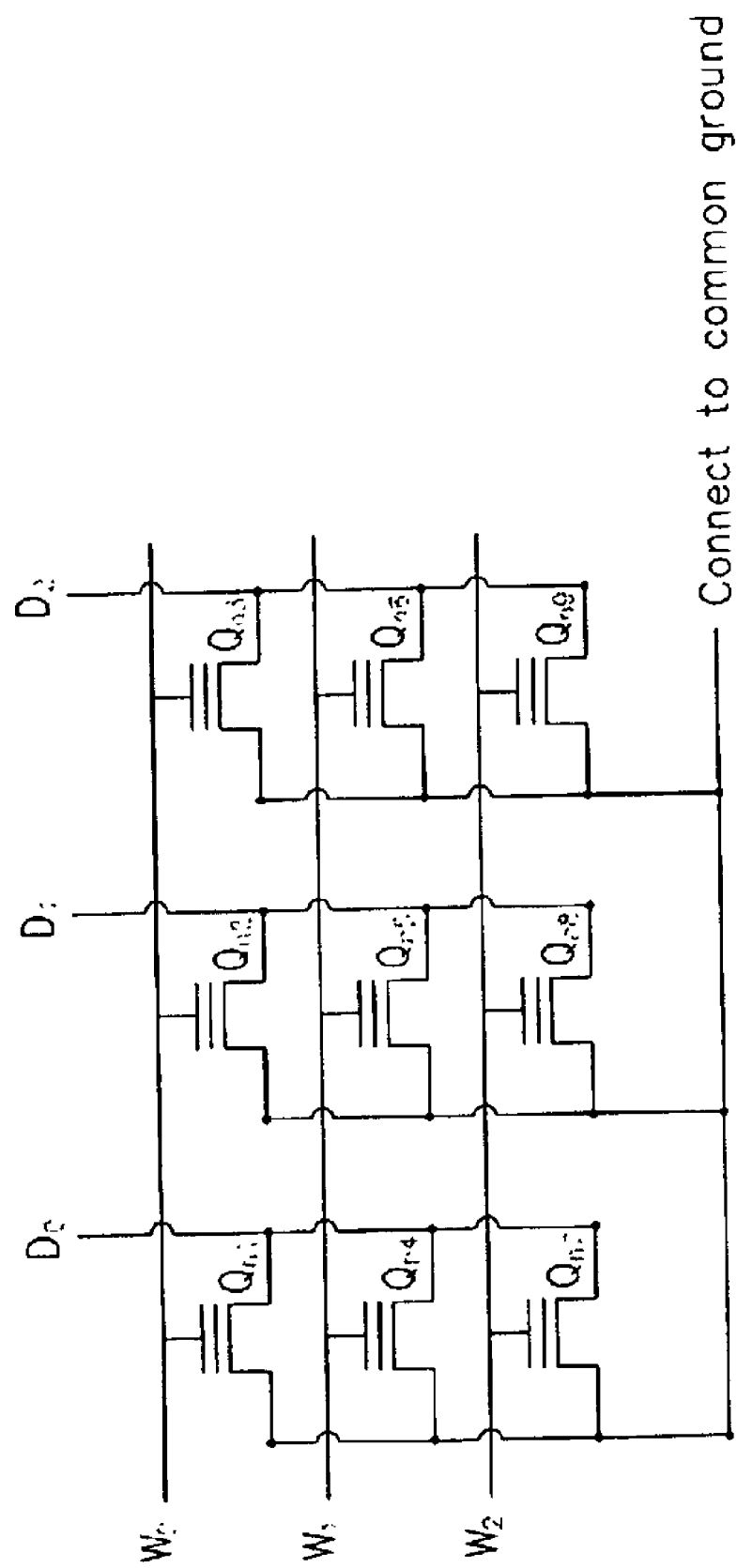
FIG. 2 is a circuit diagram of a trench type flash memory device of the current invention.
Figure 3:
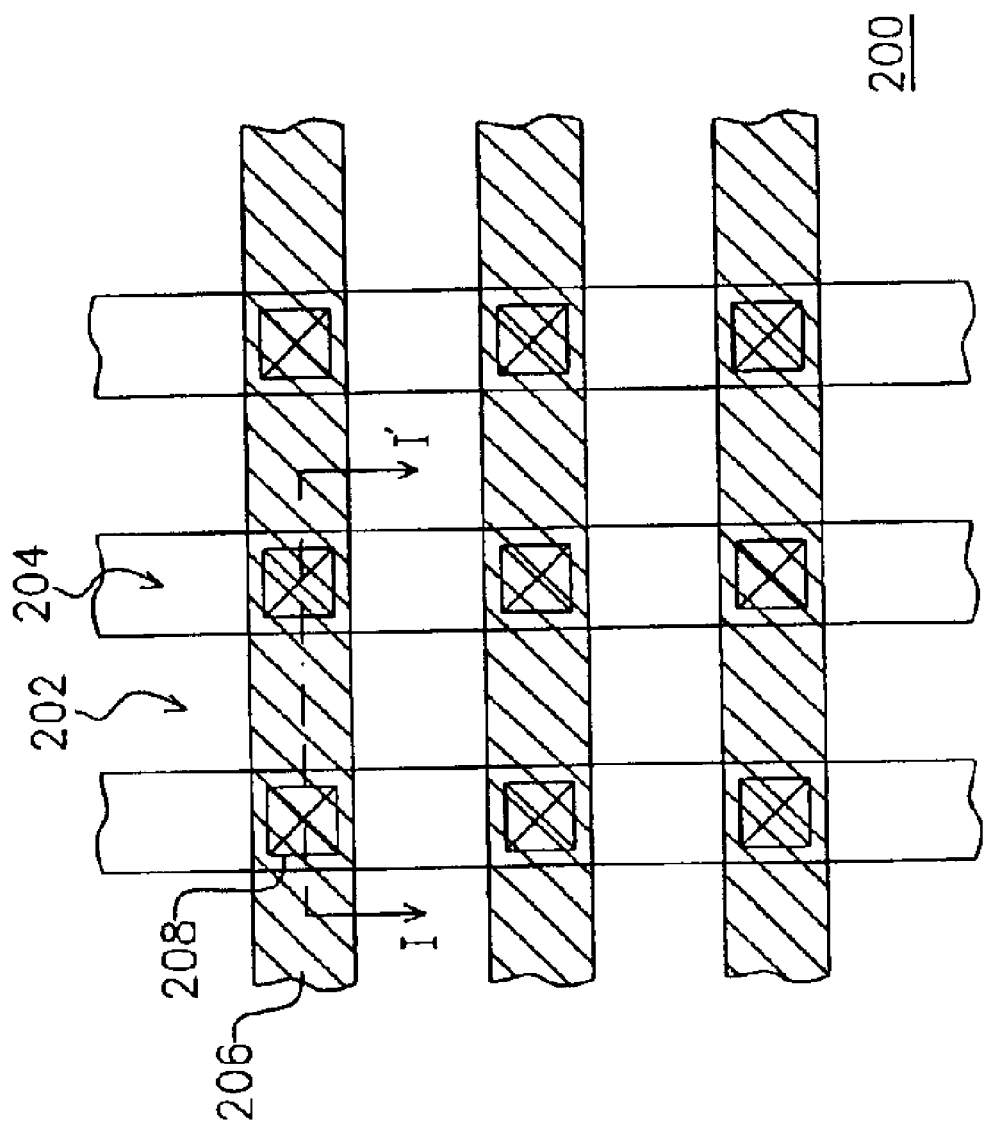
FIG. 3 is a schematic, upper view of a trench type flash memory device of the current invention.
Figure 4:
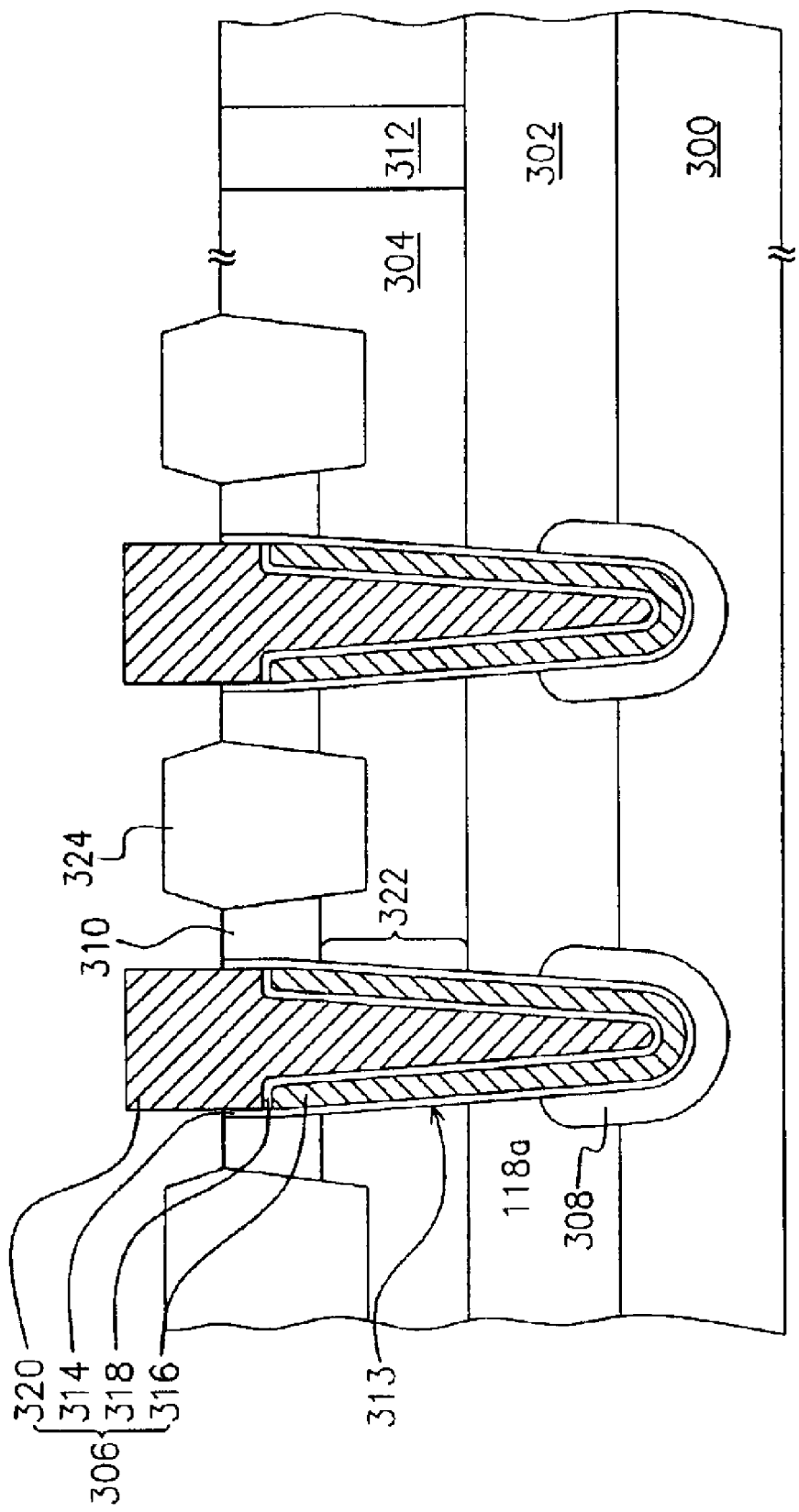
FIG. 4 is a schematic, cross-sectional view of a trench type flash memory device of the current invention.

FIG. 2 shows the cross-sectional view of the trench type flash memory device structure of this invention. According to FIG. 2, the trench flash memory device of this invention comprises a substrate 200, a deep n-type well region 202, a p-type well region 204, a gate structure 206, a source region 208, a drain region 210, and an n-type well region 212.

In the above device structure, the gate structure 206 is formed inside of a trench 213, which is located in the substrate 200. The gate structure 206 comprises, from the surface of the trench to the center of the trench, a tunnel oxide layer 214, a floating gate 216, a gate dielectric layer 218, and a control gate 220, where the tunnel oxide 214, the floating gate 216 and the gate dielectric layer 218 are wrapped around the control gate 220.

The deep n-type well region 202 is located in the substrate 200. The p-type well region 204 is located in the deep n-type well region 202. The gate structure 206 is located inside the substrate 200, and runs through the p-type well region 204 and the deep n-type region 202. The source region 208 is located in the deep n-type well region and under the gate structure 206. The drain region 210 is located in the top portion of the substrate 200 as well as on top of the gate structure 206. The region between the drain region 210 and the deep n-type region 202 serves as the channel region 222 of the trench flash memory device. The n-type well region 212 runs through the p-type well region 204 and connects to the deep n-type well region 202.

According to the above description, this invention provides a method of forming a trench in the substrate and followed with forming a source region in the substrate surrounding the bottom region of the trench. A tunnel oxide layer, a floating gate, a gate dielectric layer and a control gate are sequentially formed in the trench. A drain region is further formed in the substrate near the top portion of the trench. The well regions are used to connect the source regions, and the region between the well region and the drain region near the trench is used as the channel region. Comparing with the conventional stack gate flash memory device, since the trench flash memory device of the present invention has a cylindrical shape with the tunnel oxide layer, the floating gate and the gate dielectric layer wrapping around the control gate, the overlap area between the floating gate and the control gate is increased, resulting in a higher gate coupling rate (GCR), a lower required operational voltage and a higher device operation speed and efficiency. In addition, the channel region of the trench flash memory device in this invention is placed in the substrate at the outside and around the sidewall of the trench (vertical channel). The device integration density thus increases and problems occurring during the reduction of device dimensions is prevented by controlling the trench depth to precisely control the channel length. Further, the cylindrical memory cell structure can increase the current density and increase an efficiency of the programming or the erasing operations of the memory device.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. A trench flash memory device, comprising:
    a substrate having a trench;
    a gate structure, which is located in the trench, comprising a tunnel oxide layer, a floating gate over the tunnel oxide layer, a gate dielectric layer over the floating gate and a control gate over the gate dielectric layer, wherein the tunnel oxide layer, the floating gate and the gate dielectric layer wrap around a bottom portion of the control gate;
    a source region, located in the substrate around the bottom of the trench; and
    a drain region, located in the substrate adjacent to the top of the trench.

2. The device of claim 1, further comprising:
    a first well region of a first conductive type, formed in the substrate and connected with the source region;
    a second well region of a second conductive type, formed above the first well region; and
    a third well region of the first conductive type formed in the substrate, which connects the second well region with the first well region.

3. The device of claim 2, wherein the first well region having the first conduction type includes a deep n-type well region.

4. The device of claim 2, wherein the second well region having the second conduction type includes a p-type well region.

5. The device of claim 2, wherein the third well region having the first conduction type includes an n-type well region.

6. The device of claim 1, wherein the gate dielectric layer includes silicon oxide/silicon nitride/silicon oxide layer.

7. The device of claim 1, wherein the floating gate has a top surface lower than the upper surface of the substrate.

8. The device of claim 1, wherein the control gate has a top surface higher than the upper surface of the substrate.

9. A trench flash memory device, comprising:
    a substrate having a trench;
    a gate structure, located in the trench, comprising a tunnel oxide layer disposed conformal to the trench, a floating gate disposed over the tunnel oxide layer, a gate dielectric layer disposed over the floating gate and a control gate disposed over the gate dielectric layer, wherein the tunnel oxide layer, the floating gate and the gate dielectric layer surround a bottom portion of the control gate;
    a first doped region, located in the substrate around a bottom of the trench; and
    a second doped region, located in the substrate adjacent to a top of the trench.

10. The device of claim 9, further comprising:
    a first well region of a first conductive type, formed in the substrate and connected with the source region;
    a second well region of a second conductive type, formed above the first well region; and
    a third well region of the first conductive type, formed in the substrate, which connects the second well region with the first well region.

11. The device of claim 9, wherein the first doped region is a source region and the second doped region is a drain region.

12. The device of claim 10, wherein the third well region having the first conduction type includes an n-type well region.

13. The device of claim 9, wherein the gate dielectric layer includes silicon oxide/silicon nitride/silicon oxide layer.

14. The device of claim 9, wherein the floating gate has a top surface lower than the upper surface of the substrate.

15. The device of claim 9, wherein the control gate has a top surface higher than the upper surface of the substrate.

16. A trench flash memory device, comprising:

a substrate having a trench; and a gate structure, located in the trench, comprising a tunnel oxide layer disposed conformal to the trench, a floating gate disposed over the tunnel oxide layer, a gate dielectric layer disposed over the floating gate and a control gate disposed over the gate dielectric layer, wherein the tunnel oxide layer, the floating gate and the gate dielectric layer surround a bottom portion of the control gate;

a source region, located in the substrate around the bottom of the trench;

a drain region, located in the substrate adjacent to the top of the trench;

a first well region of a first conductive type, formed in the substrate and connected with the source region;

a second well region of a second conductive type, formed above the first well region; and a third well region of the first conductive type, formed in the substrate, which connects the second well region with the first well region.

17. The device of claim 16, wherein the third well region having the first conduction type includes an n-type well region.

18. The device of claim 16, wherein the gate dielectric layer includes silicon oxide/silicon nitride/silicon oxide layer.

19. The device of claim 16, wherein the floating gate has a top surface lower than the upper surface of the substrate.

20. The device of claim 16, wherein the control gate has a top surface higher than the upper surface of the substrate.

* * * * *